United States Patent
Sinha et al.

(10) Patent No.: US 9,837,975 B2
(45) Date of Patent: Dec. 5, 2017

(54) TEMPERATURE DRIFT COMPENSATION OF MEMS RESONATORS

(71) Applicant: Cymatics Laboratories Corp., Pittsburgh, PA (US)

(72) Inventors: Rajarishi Sinha, Pittsburgh, PA (US); David Francois Guillou, Pittsburgh, PA (US)

(73) Assignee: CYMATICS LABORATORIES CORP., Pittsburgh, PA (US)

( * ) Notice: Subject to any disclaimer, the term of this patent is extended or adjusted under 35 U.S.C. 154(b) by 528 days.

(21) Appl. No.: 14/230,584

(22) Filed: Mar. 31, 2014

(65) Prior Publication Data

US 2014/0292153 A1    Oct. 2, 2014

Related U.S. Application Data

(60) Provisional application No. 61/807,093, filed on Apr. 1, 2013.

(51) Int. Cl.
*H03H 9/02* (2006.01)
*H03H 3/04* (2006.01)
*H03H 9/13* (2006.01)
*H03H 9/17* (2006.01)

(52) U.S. Cl.
CPC ............. *H03H 3/04* (2013.01); *H03H 9/13* (2013.01); *H03H 9/175* (2013.01); *H03H 2003/0407* (2013.01)

(58) Field of Classification Search
CPC ...... H01L 41/0815; H03H 9/13; H03H 9/175; H03H 9/15; H03H 9/17; H03H 9/171
USPC .......................................................... 310/346
See application file for complete search history.

(56) References Cited

U.S. PATENT DOCUMENTS

| | | | |
|---|---|---|---|
| 6,049,155 A * | 4/2000 | Graebner | H03H 9/145 |
| | | | 310/313 A |
| 7,408,428 B2 * | 8/2008 | Larson, III | H03H 9/02102 |
| | | | 310/346 |
| 8,089,195 B2 | 1/2012 | Sinha et al. | |
| 2003/0128081 A1 | 7/2003 | Ella et al. | |

(Continued)

OTHER PUBLICATIONS

H. Matsumoto, "Positive temperature coefficient of elastic modulus in the high-temperature phase of NiTi", Journal of Materials Science Letters 13, 1994, pp. 955-956.

(Continued)

*Primary Examiner* — Derek Rosenau
(74) *Attorney, Agent, or Firm* — Botos Churchill IP Law LLP

(57) ABSTRACT

A resonator device comprising a piezoelectric material and at least one electrode, the device also provided with a material with a positive coefficient of stiffness, wherein the material is disposed in the device as an electrode or as a separate layer adjacent the piezoelectric material formed as one or more layers in the device. The material that performs the temperature compensating function is selected from the group consisting of ferromagnetic metal alloys, shape-memory metal alloys, and polymers, wherein the selected material has a temperature coefficient that varies with the relative amounts of the individual constituents of the compositions and wherein the composition is selected to provide the material with the positive coefficient of stiffness.

4 Claims, 14 Drawing Sheets

(56) References Cited

U.S. PATENT DOCUMENTS

| | | |
|---|---|---|
| 2009/0152983 A1 | 6/2009 | Sinha et al. |
| 2010/0194499 A1 | 8/2010 | Wang et al. |
| 2011/0266952 A1 | 11/2011 | Cho |
| 2012/0079692 A1 | 4/2012 | Sinha et al. |
| 2012/0098611 A1 | 4/2012 | Sinha et al. |
| 2014/0292149 A1* | 10/2014 | Zou ....................... G10K 9/122 310/335 |

OTHER PUBLICATIONS

International Search Report and Written Opinion for Application No. PCT/US2014/032370 dated Aug. 7, 2014.

* cited by examiner

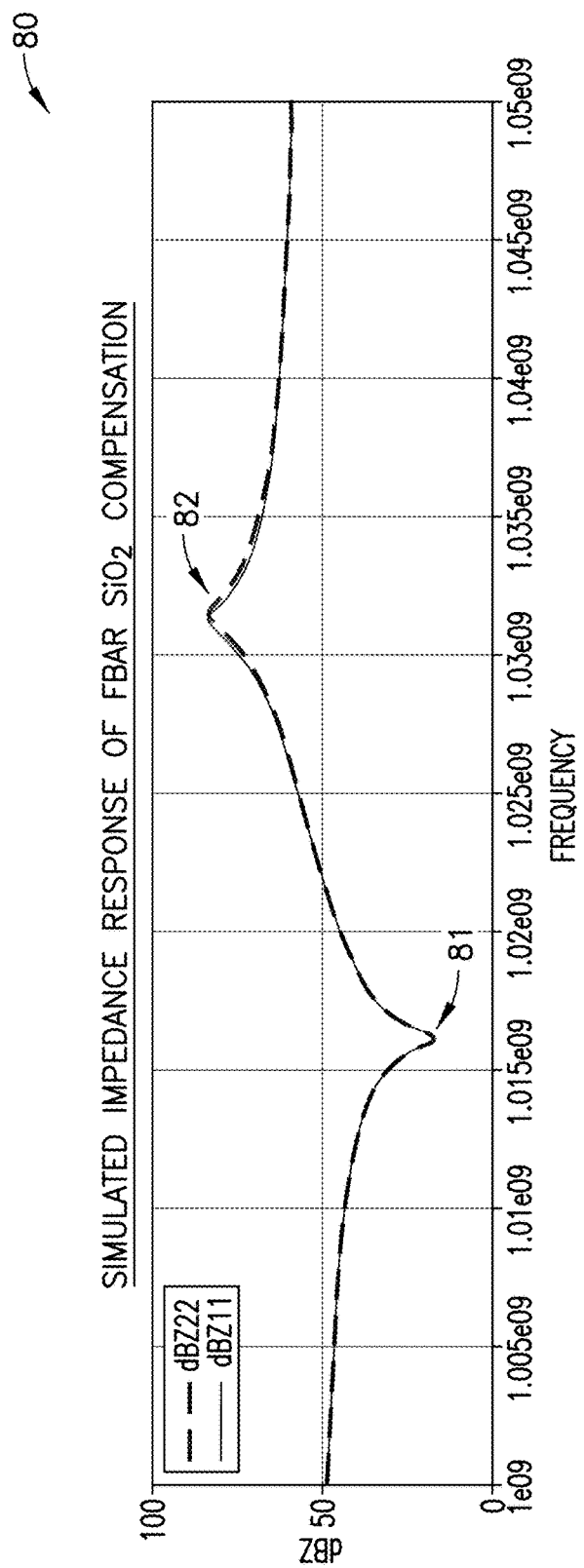

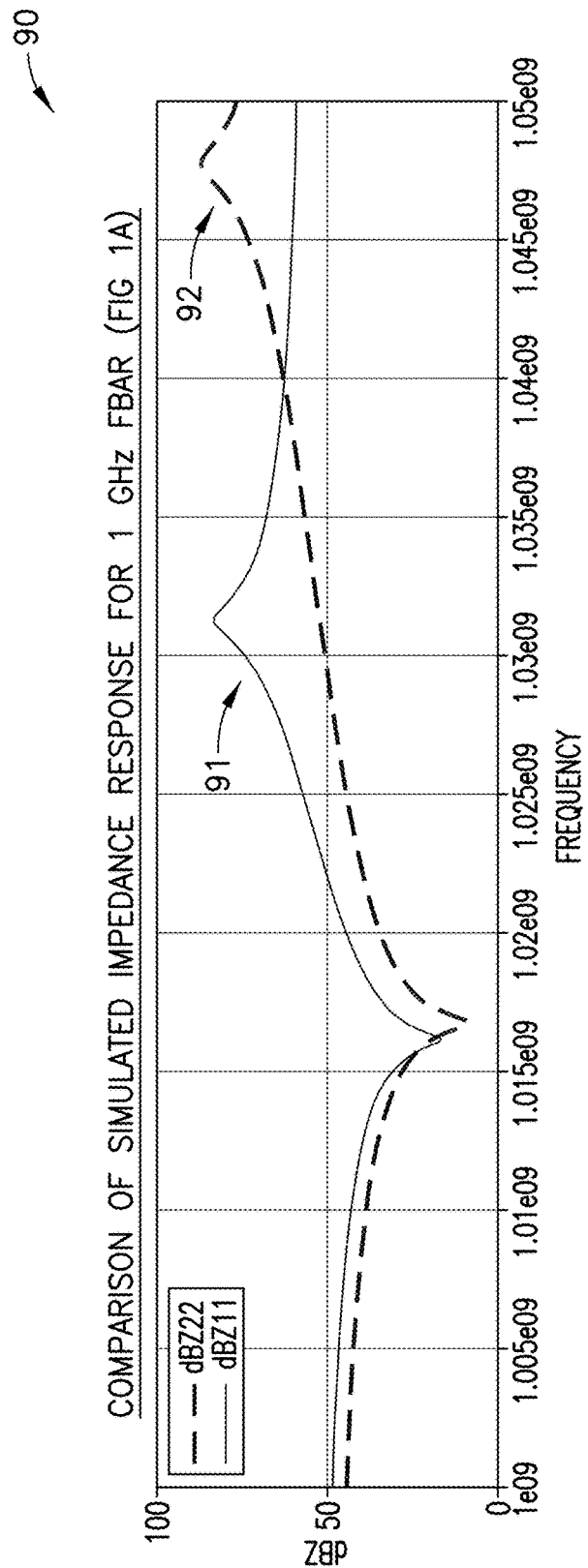

TEMPERATURE DRIFT COMPENSATION OF MEMS RESONATORS

CROSS-REFERENCE TO RELATED APPLICATIONS

This application claims the benefit of the filing date of U.S. Provisional Patent Application No. 61/807,093 filed Apr. 1, 2013, and is related to U.S. patent application Ser. No. 13/339,505 filed on Dec. 29, 2011 which is a divisional of U.S. patent application Ser. No. 12/002,524, filed Dec. 17, 2007, and issued as U.S. Pat. No. 8,089,195 on Jan. 3, 2012 entitled "Integrated Acoustic Bandgap Devices for Energy Confinement and Methods of Fabricating Same," and U.S. patent application Ser. No. 13/326,777 which was filed on Dec. 15, 2011 and is entitled "Array of BAW Resonators With Mask Controlled Resonant Frequencies," the disclosures of which are hereby incorporated herein by reference. This application is also related to U.S. Provisional Application No. 61/807,100 filed on Apr. 1, 2013 and corresponding U.S. patent application Ser. No. 14/230,155 filed Mar. 31, 2014 which are incorporated by reference herein.

FIELD OF THE INVENTION

The present invention relates to the compensation of frequency drift due to temperature change in bulk-acoustic wave resonators, lumped mass-spring mechanical resonators, and other mechanical resonators and electro-mechanical resonators.

BACKGROUND OF THE INVENTION

Many mechanical, electrical and electronic devices incorporate one or more mechanical or electro-mechanical resonator to achieve their functionality and response. A first class of such devices include clock generators, reference frequency generators, crystal oscillators, RF or microwave oscillator, local frequency oscillators, etc. in which the resonator sets (or contributes to set) the frequency of the device's output signal. We refer to this first class of devices as clock generators. A second class of such devices include filters (including radio frequency (RF) filters, etc.), duplexers (and similar devices that feature more than 2 ports, e.g. quadplexers), circulators, isolators, diplexers (and similar devices that feature more than 2 ports, e.g. triplexers, etc.), combiners, splitters, waveguide, etc. in which the resonator (s) set (or contribute to set) the frequency response of the device. We refer to this second class of devices as filters. A third class of such devices include sensors (including acceleration sensors, vibration sensor, pressure sensors, etc.), actuators (such as ultrasound wave generators, force actuators, momentum actuators), electrically-controlled mirror, electrically-controlled pump, other types of electro-mechanical transducers, etc. in which the resonator sets (or contributes to set) the conversion factor (also referred to as sensitivity, gauge factor, etc.) of the device. We refer to this third class of devices as transducers.

In order to achieve their targeted performance, many of the above-mentioned clock generators, filters and transducers require one or more constituent resonator(s) to operate at a fixed or near-fixed frequency (or a metric related to the resonator response, as discussed below) over a specified temperature range. The deviation from such a specified frequency is referred to as frequency drift. A resonator that features little or low frequency drift is regarded as having a high degree of frequency stability. Resonators are not required to have a high degree of frequency stability. For other applications, the resonator frequency is required to change slightly as a function of temperature. For example, in certain clock generator designs, the oscillator circuit causes the oscillation frequency to change over temperature, and the resonator can be specified to have a slight frequency drift in order to cancel the circuit-induced frequency drift. Described herein are methods and devices that control the temperature-induced resonator frequency drift to achieve zero drift as well as to achieve a non-zero drift within the range of +/−5 ppm per degree Kelvin.

Frequency drift, typically, is defined as the change of frequency at which the real part or the imaginary part or the magnitude or the argument (i.e. phase) of the resonator's complex impedance equals a specified value. Changes in frequency associated with a minimum or maximum or with a specified response criterion or set of criteria are other examples of frequency drift. Changes in frequency associated with any element of the resonator's impedance matrix or any related metric such as the scattering matrix or any other stimulus and/or response metric including non-linear metrics (such as so-called "X parameters"), time-variant metrics, etc. or any combination thereof) are yet further examples of frequency drift. Alternately, frequency drift can be defined as the change in the range of frequency (or bandwidth) over which a response criterion is met, such as the change in the bandwidth in which a resonator's insertion loss is higher than −1 dB. However, one skilled in the art will appreciate that metrics based on the resonator response other than frequency can be relevant for different applications. For example, for a RF filter application, a drift in device performance can result from the change of insertion due to temperature change. For purposes of illustration herein, the description of the invention is framed in the context of frequency drift but the control of frequency drift described herein also applies to more general resonator response drift metrics.

Frequency drift over temperature is typically expressed or specified in part-per-million per degree Kelvin (ppm/K), or in part-per-million over the specified operating temperature range (or, alternately over a given ambient temperature range, etc.).

DEFINITIONS

Mechanical resonator, as used herein, is a mechanical device that can vibrate at a certain frequency with a particular mode shape.

Electro-mechanical resonator, as used herein, is an electrical/mechanical transducer that has at least one electrical port coupled to at least one mechanical device that can vibrate at a specified frequency with a particular mode shape, such that the state (including the motion, displacement, deformation, etc.) of the mechanical device can be read out and, optionally, driven through the at least one electrical port. An electro-mechanical resonator can be sensitive to other stimuli than those applied through the at least one electrical port. For example, the resonator utilized in an acceleration sensor is sensitive to inertial acceleration. This discussion applies broadly to the control of the temperature drift of all mechanical and electro-mechanical resonators, without consideration of size, method of fabrication, and other considerations.

A bulk acoustic wave (BAW) resonator is one example of electro-mechanical resonator. BAW resonators can be realized in suspended configurations (referred to as Film Bulk Acoustic Resonator—FBAR) or solidly mounted configurations (referred to Solidly Mounted Resonator—SMR), among other. Examples of such are described in U.S. Pat. Nos. 8,089,195 and 8,030,823, which are incorporated by reference herein. An example of a simple FBAR is shown in FIG. 1. In the case of an ideal BAW resonator where all acoustic energy is confined in the piezoelectric layer, the series resonance frequency $F_0$ is approximately expressed as:

$$F_0 = (k_m/L) * \sqrt{(c/\rho)} \quad (1)$$

where L is the critical dimension of the mode shape, $k_m$ is a constant depending on the number of wavelengths in the standing wave trapped between electrodes, c is a function of the stiffness matrix, and $\rho$ is the density of the piezoelectric material. $k_m$ is equal to 0.5 for a thickness-extensional mode. $k_m$ is equal to 1 for a thickness-shear mode (aka lateral mode). Both the critical dimension L and the stiffness coefficient c, and to a lesser extent the density rho, vary with temperature. Broadly, the resonator response (not just the resonator's series resonance frequency) changes over a wide range of frequencies as a result of temperature change.

An example of mechanical resonator is a lumped mass-spring resonator. A simple cantilever resonator whose lowest mode is a flexural mode is shown in FIG. 2. The flexural resonance frequency $F_0$ is expressed as:

$$F_0 = (C/(2*\Pi)) * \sqrt{(k_s/M)} \quad (2)$$

where $k_s$ is the temperature-dependent spring constant, M is the mass, and C is a constant related to the mode of resonance. The spring constant ($k_s$) is constant at a given temperature. Broadly, the resonator response not just the resonator's resonance frequency) changes over a wide range of frequencies as a result of temperature change.

For purposes of illustration, embodiments of the present invention are described in the context of BAW resonator devices. One skilled in the art will understand that the principles of the invention as applied to BAW resonators apply equally to distributed mass-spring mechanical resonators (such as resonant membranes), lumped mass-spring resonators, and in general to any mechanical resonator, electro-mechanical resonator and non-resonating mechanical (including electro-mechanical) device (such as a travelling wave device) where the mechanical or electro-mechanical properties of the device determine its response.

The series resonance frequency of a BAW resonator is set by the acoustic velocity, thickness and geometry of the constituent thin film materials. A change of operating temperature causes several changes in the resonator performance because a change of operating temperature imparts different changes to each of the resonator constituents. First, the dimensions of the materials in the resonator change, and this change is quantified by the 'temperature coefficient of expansion' (TCE). Second, the density of resonator materials changes, and this change is quantified by the 'temperature coefficient of density', also sometimes called the 'volume temperature coefficient'. Third, the stiffness tensor of the materials changes and this change is quantified by the 'temperature coefficient of stiffness' (TCC). A change in any combination of these material properties causes a change in the frequency response of the resonator.

Differentiating Equation 1 with respect to temperature with $k_m = \frac{1}{2}$ and $\rho = m/V$, where V and m are respectively the volume and mass of the resonating body, we get:

$$\frac{1}{F_0}\frac{dF_0}{dT} = \frac{1}{2}\left[\underbrace{\frac{1}{c}\frac{dc}{dT}}_{TCC} + \underbrace{\frac{1}{V}\frac{dV}{dT}}_{\alpha_V}\right] - \underbrace{\frac{1}{L}\frac{dL}{dT}}_{TCE} \quad (3)$$

where the mass m is constant, $\alpha_v$ is the volume temperature coefficient, TC is the temperature coefficient, TCE is the temperature coefficient of expansion, and TCC is the temperature coefficient of stiffness, or elastic modulus.

In most naturally-occurring materials, the temperature coefficient of volume $\alpha_v$ is very small compared to the other two coefficients. The temperature coefficient of stiffness of a typical aluminum nitride (AlN) FBAR resonator is −20 to −30 ppm/K. The great majority of naturally occurring materials have a negative temperature coefficient of stiffness.

The temperature-induced frequency drift of a resonator can be controlled and compensated by electrical means and by mechanical means. Electrical control of the resonator response is achieved by connecting an electrical circuit to the resonator's electrical port(s) and altering the response of the electrical circuit. For example, the electrical circuit can present a variable negative reactance (as provided by a variable capacitor) in series with the resonator or a variable positive reactance (as provided by a variable inductor) in shunt with the resonator. However, electrical control means are only practical for electro-mechanical resonators, they require power to operate, and they can degrade the resonator response by increasing noise, loss and nonlinearity.

Mechanical control of the resonator response is achieved by incorporating materials in or around the resonator that have a positive TCC to cancel the negative temperature coefficients of most commonly used resonator materials.

In the case of a BAW resonator, the positive-TC material (for positive TC materials the physical property increases with increasing temperature) must be located in the acoustic path (i.e. in the region of the resonator where the strain wave is confined), preferably at a location where there is significant displacement (hence significant strain energy), i.e. at or close to an anti-nodal region of the mode of vibration. As a result, in a thickness-extensional mode BAW resonator, the positive-TC material should be located adjacent to the piezoelectric film.

Silicon dioxide ($SiO_2$) is widely used as the temperature compensating material for BAW resonators and other MEMS resonators because it is a commonly available MEMS material and its temperature coefficient of stiffness is positive and large, typically between +70 to +85 ppm/K. In a mechanical resonator, the temperature-compensating $SiO_2$ is incorporated in the material stack that forms the suspension. In a thickness-extensional mode BAW resonator, for the reason explained above, a $SiO_2$ film is located between the piezoelectric material and an electrode.

However, the use of $SiO_2$ for temperature compensation has drawbacks. First, $SiO_2$ is a dielectric and it has a lower dielectric constant than the piezoelectric materials (aluminum nitride or zinc oxide) commonly used in BAW resonators. Therefore, the temperature-compensation $SiO_2$ layer decreases the resonator coupling factor (commonly referred to as $k^2$). The reduction in the resonator coupling factor reduces the bandwidth that can be achieved in an RF filter application. The reduction in the resonator coupling factor also reduces the frequency range over which the resonator can be tuned. The reduction in the range of tuning frequencies can limit the performance/use of such devices for certain application such as clocking.

Second, the temperature-compensation $SiO_2$ layer reduces the resonator's quality factor by about 30%, which limits optimal performance of the resonators. For example, the lower quality factor limits reductions in insertion loss that might otherwise be achieved in RF filter applications with the resonator's quality factor were higher. The lower quality factor also limits improvements in the phase noise for resonators used as oscillators that might otherwise be achieved if the resonator's quality factor were higher. Furthermore, the value of the temperature coefficient of stiffness of $SiO_2$ is fixed by its microstructure. Depending on the deposition conditions, the TCC of the $SiO_2$ is in the range of about +70 ppm/K to about +85 ppm/K. It is not possible to alter the microstructure of $SiO_2$ to attain other values of the temperature coefficient.

In the case of a lateral-mode resonator, displacement is in the lateral direction, and it is not practical to insert $SiO_2$ on the side of the AlN using MEMS manufacturing technology. A state-of-the-art technique consists in doping the silicon substrate that supports the resonator so that its temperature coefficient is positive and compensates the resonator's native negative temperature coefficient. However, this doped silicon compensation approach is sensitive to within-wafer and wafer-to-wafer doping variations.

Therefore, temperature compensating material that does not degrade the quality factor and the coupling coefficient as much as $SiO_2$, and that have a composition that can be selected to achieve a particular value of the temperature coefficient, so that optimal resonator performance is achieved, continue to be sought.

SUMMARY OF THE INVENTION

Described here are devices and methods that use ferromagnetic metal alloys and shape-memory conductive and non-conductive metal alloys and polymers, as well as nanostructured material including graphene, graphene oxide, silicone and nano-structured cellulose that have positive temperature coefficient of stiffness (TCC) to compensate for the temperature-induced frequency drift of resonators without the drawbacks of existing techniques. This invention applies to bulk-acoustic wave resonators, distributed mass-spring mechanical resonators (such as resonant membranes), lumped mass-spring mechanical resonators, and other mechanical resonators, electro-mechanical resonators and non-resonating mechanical (including electro-mechanical) devices (such as travelling wave devices) whose response is described by classical mechanics, whether fabricated by MEMS or NEMS or other manufacturing technologies.

Most pure metals and metal alloys have a negative temperature coefficient of stiffness (TCC). As noted above, such materials lose stiffness when heated (i.e. the value of the property decreases with increasing temperature). These materials also have a positive coefficient of thermal expansion, so they increase in length when heated (i.e. the value of the property increases with increasing temperature). These two effects are both due to an increase in the energy of the atoms that results from the increase in temperature. Certain ferromagnetic materials, however, exhibit markedly different behavior. According to the embodiments described herein, such materials are configured to provide a selected temperature coefficient suited for a particular device or method.

The modulus of elasticity (E) of ferromagnetic materials and shape-memory alloys, as well as some shape-memory polymers, is a function of a number of physical properties, related by equation 4:

$$E = 4 * \Pi * \lambda^2 * \mu / k^2 \quad (4)$$

where $\lambda$ (lambda) is the magnetostrictive coefficient, $\mu$ is the reversible permeability and $k^2$ is the electromechanical coupling coefficient. Note that equation 4 applies below the Curie temperature, which is the temperature at which the material properties change from ferromagnetic to paramagnetic. Each of the material parameters lambda, $\mu$ and $k^2$ is affected by composition, strain and temperature. Therefore, in order to achieve a modulus of elasticity that remains constant within a range of temperatures, it is necessary to select a composition for which $\lambda^2 * \mu / k^2$ is constant. Based on equation (4) and the additional guidance provided herein one skilled in the art can readily identify other materials that will provide a temperature compensation function because such materials have the desired positive-TCC. It is advantageous if the temperature compensation layer is conductive to avoid issues associated with the use of insulating materials as temperature compensation layers in the context of the devices described herein.

The use of positive-TCC metal alloys is an improvement over $SiO_2$ and other mechanical control approaches known in the art for temperature compensation. Positive-TCC metal alloys are good electrical conductors, so they can be used to form electrodes, either alone or in combination with other material, to perform charge collection and conduct signals, and perform the desired temperature compensation function.

In a thickness-extensional mode BAW resonator, the use of a positive-TCC metal alloy provides for a higher coupling factor than conventional metals because it is a conductor and does not act as a capacitor in series with the resonator, unlike $SiO_2$ in conjunction with conventional metal electrodes. Furthermore, the use of a positive-TCC metal alloy enables a higher quality factor (Q) because such ferromagnetic material has a lower acoustic loss than dielectrics like $SiO_2$. Further, compared to known temperature-compensated BAW resonators, a BAW resonator that incorporates a positive-TCC metal alloy uses fewer materials and therefore benefits from a simpler manufacturing process. Alternately, the positive-TCC metal alloy can be located between the piezoelectric material and a conventional metal electrode as an alternative to the use of $SiO_2$ as the temperature compensating layer. This provides a device having a higher coupling factor and quality factor, but does not simplify the manufacturing process as much as if the positive-TCC metal alloy is both the electrode and the temperature compensating layer.

A further advantage of the methods and device described herein is that the positive-TCC metal alloys can be fabricated over the top of all types of resonators (thickness-mode, lateral-mode, and flexural-mode) to compensate their temperature drift. For example, in a solidly-mounted thickness-mode resonator, a positive-TCC metal alloy can be used to form one of the layers of the Bragg reflector. As noted above, $SiO_2$ is not suited for use as a temperature compensating layer for lateral mode devices, and doping strategies do not provide the desired consistency in performance.

The material parameters $\lambda$, $\mu$ and $k^2$ (equation 4) depend on the crystal structure of the alloy. The crystal structure, in turn, depends on how the material is deposited and its composition. The temperature compensating metal alloy is deposited by any conventional techniques. However, the technique is selected to provide a positive-TCC metal alloy with the desired degree of temperature compensation for the specific device design.

Sputter deposition can be combined with heating the substrate to promote crystal formation. The use of a pre-alloyed target produces better quality films than alloys deposited using targets of individual elements. Alternately, metal alloy films can be deposited by electroless plating. Deposition using electroless plating permits positive-TCC metal alloy to be deposited on structures on which it would be difficult to deposit $SiO_2$ (which is deposited under high vacuum).

Several embodiments of the present invention use a Nickel-Titanium alloy (NiTi) as the electrode material. Equi-atomic Nickel-Titanium alloy is denoted 50:50 NiTi herein. 50:50 NiTi has a positive temperature coefficient of elastic modulus over a range of temperatures, starting at a little below room temperature (270K) and extending beyond 350K. This is illustrated in FIG. 2 of Matsumoto, H., "Positive temperature coefficient of elastic modulus in the high-temperature phase of NiTi," *J. Mat. Sci. Letters,* 13, pp. 955-956 (1994). 50:50 NiTi is commercially available from Nitinol Devices & Components, Inc. as Nitinol™.

Although NiTi is the positive-TCC metal alloy described in the embodiments herein, the skilled person will appreciate that any and all ferromagnetic metal alloys and shape-memory polymers and materials that exhibit a positive TCC can be deployed in the methods and devices described herein. The term "Temperature Coefficient" as used herein refers to the temperature coefficient of elastic modulus (i.e. the temperature coefficient of stiffness, TCC), unless otherwise specified.

BRIEF DESCRIPTION OF THE DRAWINGS

A complete understanding of the present invention may be obtained by reference to the accompanying drawings, when considered in conjunction with the subsequent, detailed description, in which:

FIG. 6A is a graph view of the response of a FBAR resonator, with tungsten electrodes, an AlN piezoelectric, and temperature compensation performed by SiO₂.

FIG. 7 is a graph view of the response of two FBAR resonators, comparing SiO₂-based temperature compensation with NiTi-based temperature compensation.

For purposes of clarity and brevity, like elements and components will bear the same designations and numbering throughout the Figures.

DETAILED DESCRIPTION

Figure 1:
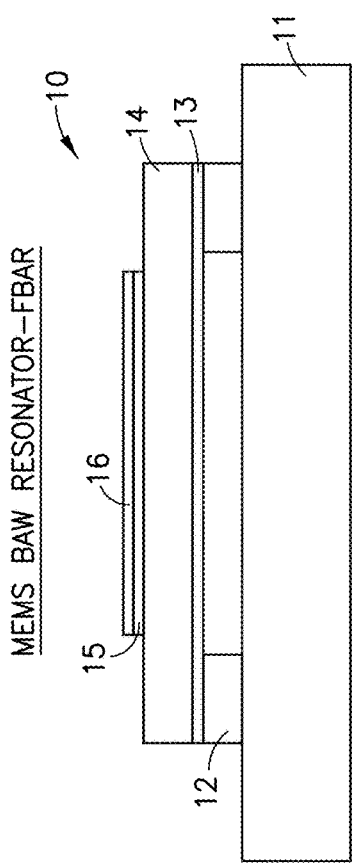
FIG. 1 is a cross section view of a prior art MEMS BAW resonator, shown in an FBAR configuration.

FIG. 1 is a cross section view of a prior art MEMS BAW resonator 10, shown in an FBAR configuration. In this configuration, the thin film is supported on an anchor 12, which in turn is supported by a substrate 11. The resonator is lower electrode 13, the piezoelectric transducer 14, and the upper electrode 16. Temperature compensation is performed by the temperature compensating layer 15. Other BAW resonator configurations including FBARs supported on a membrane or supported from above are possible, without limitation.

Figure 2:
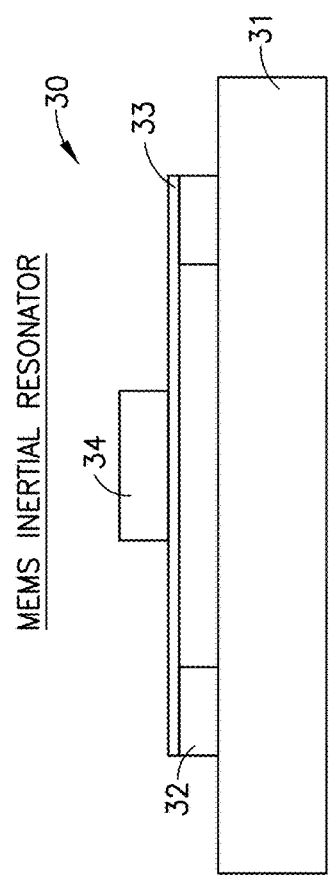
FIG. 2 is a cross section view of a prior art lumped mass-spring mechanical resonator.

FIG. 2 is a cross section view of a prior art MEMS lumped mass-spring mechanical resonator 30. In this configuration, the proof mass 34 (the mass used to characterize performance (i.e. the seismic mass) is connected to the thin film spring 33, which is supported on anchor 32 which rests on substrate 31. Other configurations including resonators supported on a membrane or supported from above are possible, without limitation.

Figure 3:
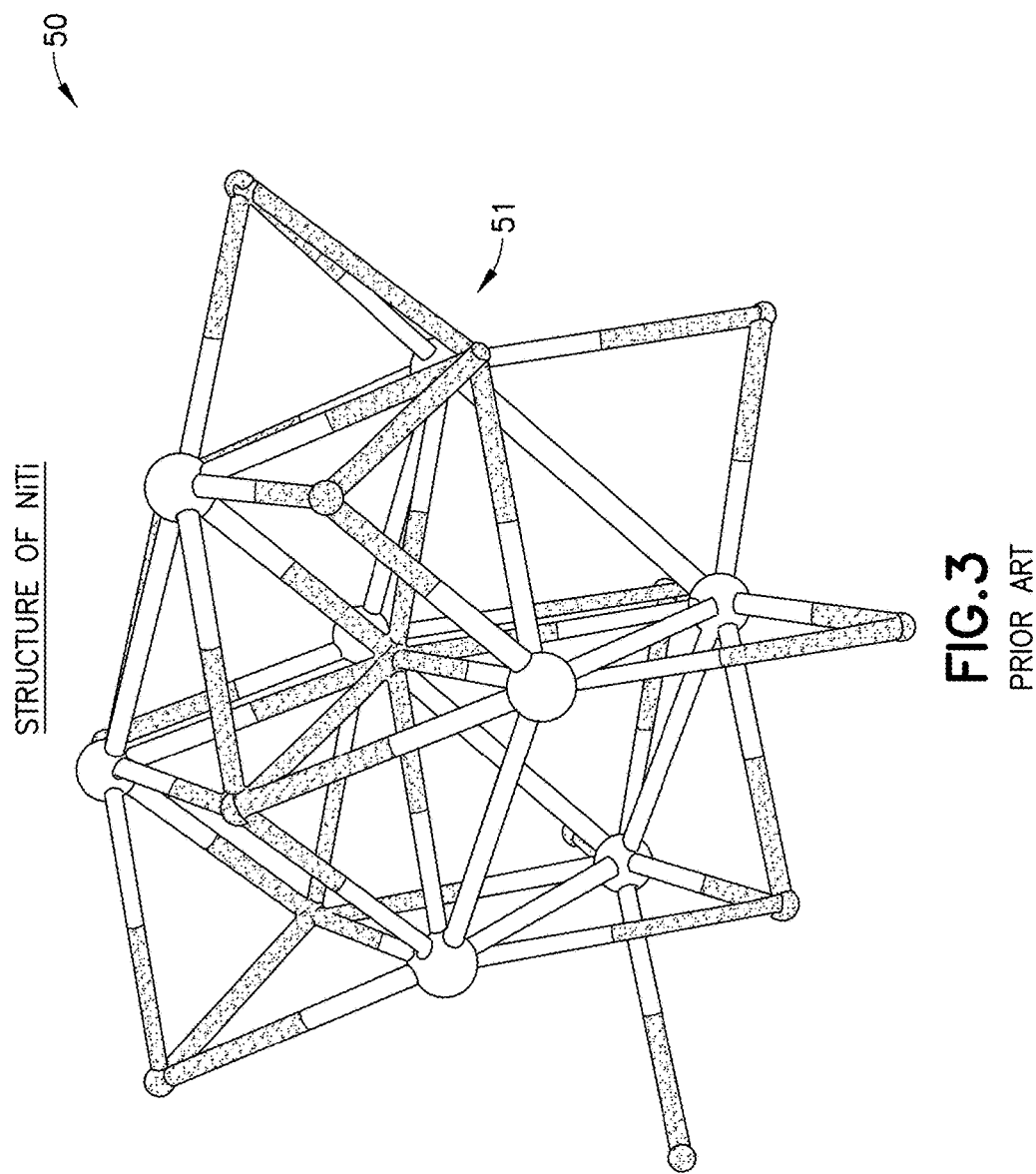
FIG. 3 is a view of the crystalline structure of nickel-titanium crystal.

FIG. 3 is a view of the crystalline structure of a 50:50 nickel-titanium crystal from prior art. The structure model 50 of the 50:50 nickel-titanium crystal 51 indicates the relative positions of the nickel and titanium ions in the crystal.

Figure 4:
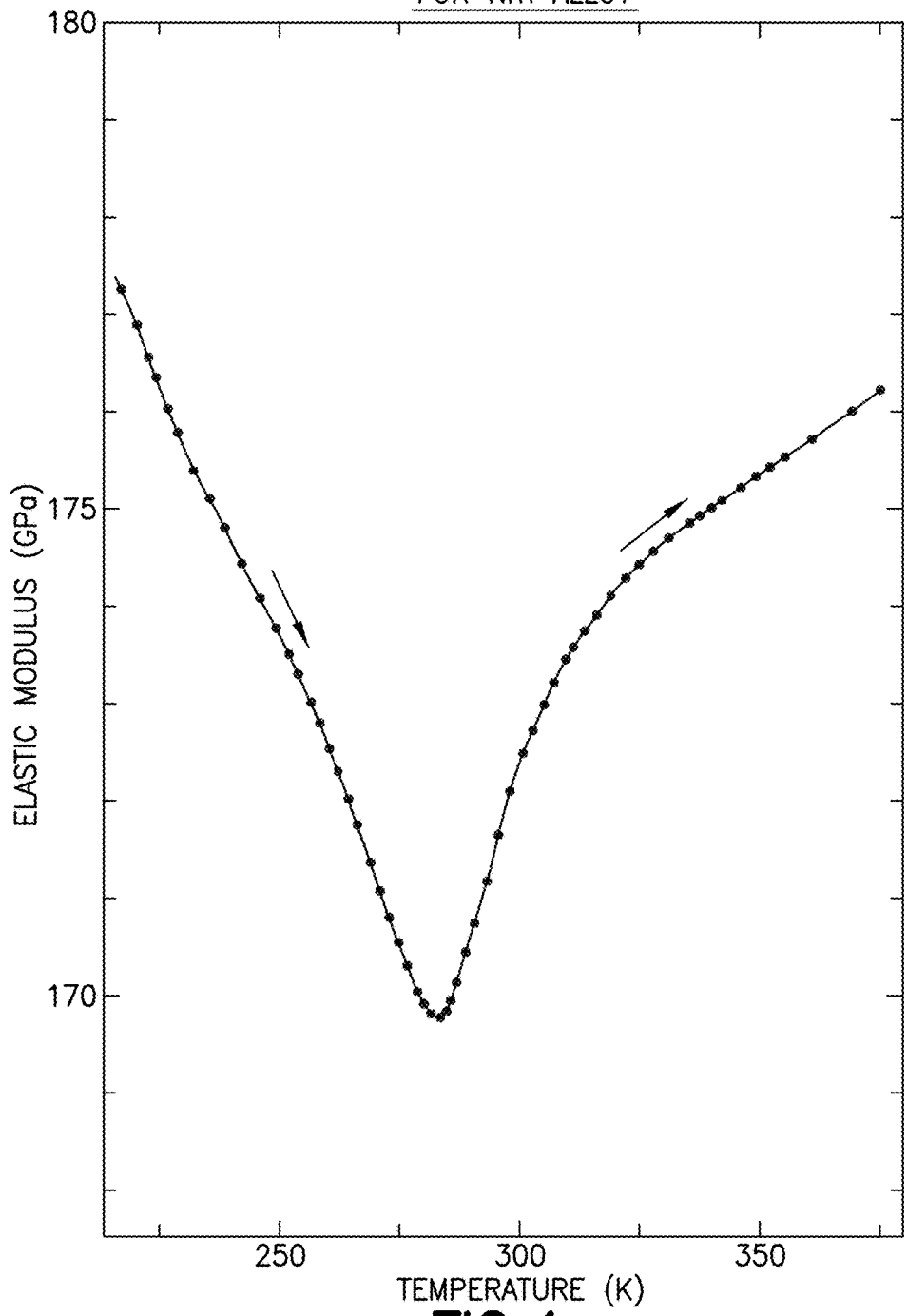
FIG. 4 is a graph of the elastic modulus of 50:50 NiTi versus temperature, reproduced from Matsumoto.

FIG. 4 is a graph 60 of the elastic modulus 61 of 50:50 NiTi versus temperature 62. The effect of temperature on the elastic modulus of 50:50 NiTi has previously been reported in Matsumoto, which is incorporated by reference herein. The elastic modulus of 50:50 NiTi has a positive coefficient regime that lies in the operating temperature range of many MEMS devices.

Figure 5:
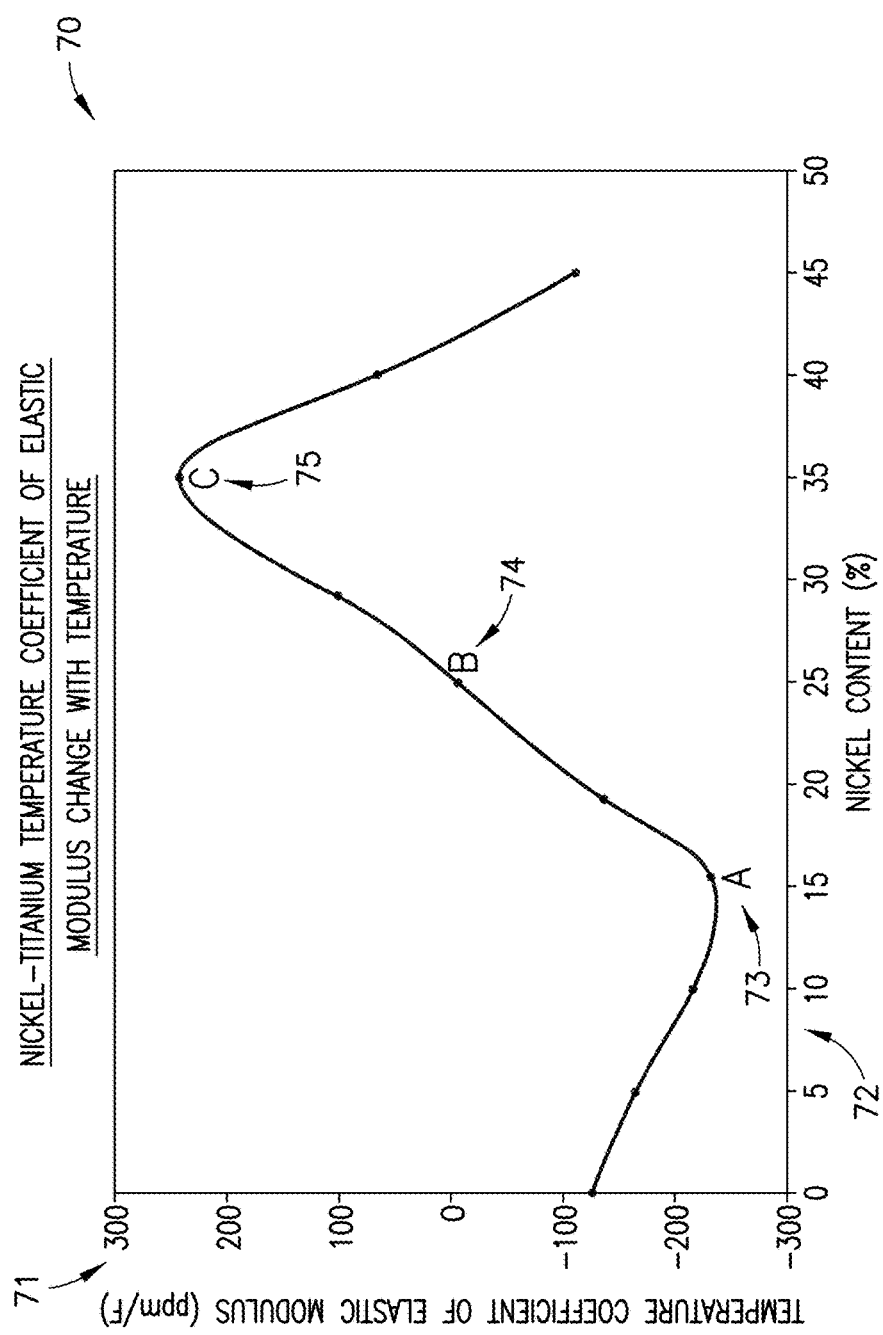
FIG. 5 is a graph of the temperature coefficient of elastic modulus of NiTi versus nickel content, reproduced from specialmetals.com.

It is also known that the relative amounts of nickel and titanium in NiTi affect the temperature coefficient of the NiTi material. FIG. 5 illustrates how the temperature coefficient of NiTi changes with increasing nickel content in the NiTi material. FIG. 5 is a graph 70 of the temperature coefficient of elastic modulus 71 of NiTi (on the y axis) versus nickel content 72 (expressed as a percentage is on the x axis). This graph is reproduced from specialmetals.com, which is incorporated by reference herein. From FIG. 5 it is observed that, as the nickel content 72 increases, the temperature coefficient changes from a negative value to a positive value. The maximum negative coefficient is at Point A (73), with a value of about −250 ppm/° F., or about −114 ppm/° C., and a nickel content of about 16%. The temperature coefficient is zero at Point B (74), which has a nickel content of about 27%. The maximum positive coefficient is at point C (75), with a value of about +250 ppm/° F., or about +114 ppm/° C., and a nickel content of about 34%.

Current research and development into the mechanical behavior of ferromagnetic materials has been focused on optimizing materials for Point B or its equivalent, so that wires and other mechanisms made of these materials do not expand under heating. Typically, NiTi materials with compositions that yield a coefficient of about zero are used for wires and other applications where no expansion of the material is desired when the temperature of the material is elevated. In the embodiments of the present invention described herein, the relative amounts of nickel and titanium in NiTi are selected to provide a desired, non-zero temperature coefficient. More broadly, the present invention contemplates selecting a composition of NiTi or other ferromagnetic metal alloys or shape-memory metal alloys or even polymers that have temperature coefficients that vary with the relative amounts of the individual constituents of the compositions. The relative amounts of the material constituents are selected to provide a desired non-zero temperature compensation effect. In the described embodiments, resonator performance is improved by selecting a composition of the temperature-compensating layer (e.g. for NiTi, by selecting a location on the FIG. 5 curve). The composition of positive TCC material is selected to compensate for countervailing changes in device performance caused by the temperature coefficients of other materials in the relevant device. Referring to FIG. 5, NiTi has temperature coefficients that vary over a wide range of compositions. Specifically, the temperature coefficients vary from the zero-TC composition (e.g. 27% nickel at point B on FIG. 5) to the maximum-TC composition (e.g. about 34% nickel at point C on FIG. 5). The selected positive temperature coefficient that results cancels the negative temperature coefficient in the other resonator materials as described above.

In certain applications, it is desirable to deposit a temperature compensating material such as NiTi with the maximum-TC composition (e.g. about 34% nickel at point C on FIG. 5). As this composition provides the maximum positive temperature coefficient, when this composition is selected, the amount of material that needs to used is less than if compositions that yield a lower positive temperature coefficient are selected. Additionally and importantly, the sensitivity of the temperature coefficient to nickel content for this particular alloy is at a minimum because the slope of the curve at point C (75) in FIG. 5 is nearly zero. Selecting the NiTi composition that corresponds to point C reduces device-to-device and wafer-to-wafer performance variations due to layer thickness manufacturing variations.

Figure 6B:
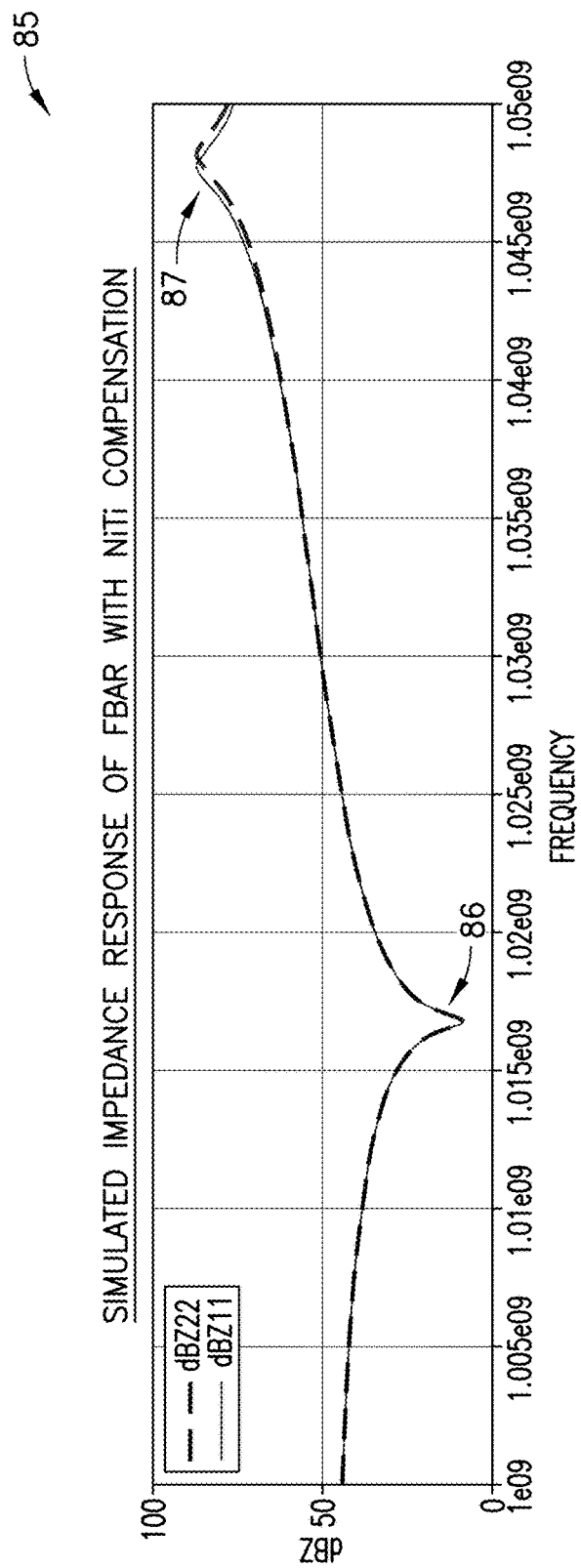
FIG. 6B is a graph view of the response of a FBAR resonator, with tungsten electrodes, an AlN piezoelectric, and temperature compensation performed by NiTi.

FIGS. 6A, 6B and 7 illustrate simulated responses over temperature for FBAR BAW resonators (illustrated in FIG. 1) and compare the response of a SiO$_2$-compensated BAW resonator (FIG. 6A) with a NiTi-compensated BAW resonator (FIG. 6B). The NiTi layer used in the simulation of FIG. 6B has a composition that corresponds to the NiTi at point C (75) of FIG. 5. The FBAR BAW resonators have an AlN piezoelectric and tungsten electrodes. The responses were simulated at temperatures of 0° C. and 100° C.

FIG. 6A is a graph 80 of a simulated impedance response of a FBAR with tungsten electrodes and an AlN piezoelectric and an SiO$_2$ temperature compensation layer. The simulated device has a series resonance frequency (at point 81) at 1.017 GHz. The frequency is swept from 1.00 to 1.05 GHz.

FIG. 6B is a graph 85 of a simulated impedance response of a FBAR with tungsten electrodes and an AlN piezoelectric, and a NiTi temperature compensation layer. The simulated device has series resonance frequency (at point 86) at 1.017 GHz. The frequency is swept from 1.00 to 1.05 GHz, as in FIG. 6A.

Comparing FIG. 6A and FIG. 6B, the parallel resonance frequency 82 of the FBAR with SiO$_2$ compensation is significantly lower than the parallel resonance frequency 87 of the FBAR with NiTi compensation. This demonstrates that the NiTi-compensated resonator has a much higher coupling coefficient k$^2$ than the SiO$_2$-compensated FBAR.

This comparison is best viewed in FIG. 7, which is a graph 90 of the individual simulated impedance response of the FBARs illustrated in FIGS. 6A and 6. The response of the SiO$_2$-compensated FBAR is curve 91, and the response of the NiTi-compensated FBAR is curve 92. The impedance response curves illustrate the higher coupling coefficient k$^2$ and the higher quality factor Q achieved for a device having a NiTi-based temperature compensation layer compared with a device having an SiO$_2$ compensation layer. Specifically, the SiO$_2$-compensated resonator has a series-resonance Q of about 2100 and a k$^2$ of 3.65%. The NiTi-compensated resonator has a series-resonance Q of about 2600 and a k$^2$ of 7.3%. Therefore, the NiTi compensated device offers an about 23.8% improvement in the Q and a 50% improvement in k$^2$ over the SiO$_2$ compensated device.

Figure 8A:
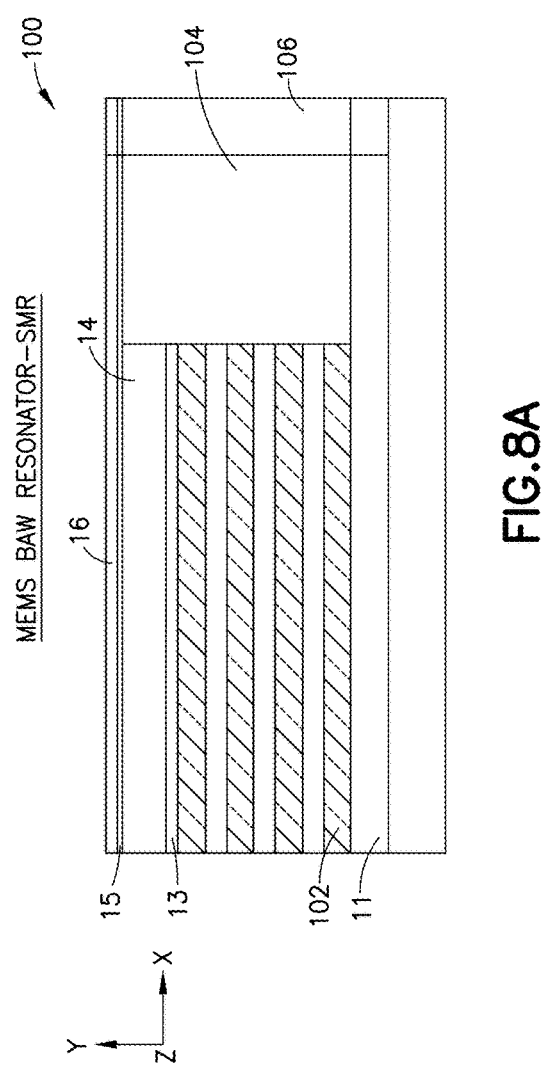
FIG. 8A is a symmetric cross section view of a MEMS solidly-mounted resonator (SMR) with AlN piezoelectric, tungsten lower electrode and upper electrode, and a NiTi temperature compensating layer.

FIG. 8A is a schematic cross section view 100 of a MEMS solidly-mounted resonator (SMR) with AlN piezoelectric 14, tungsten lower 13 and upper 16 electrodes, and a NiTi temperature compensating layer 15 located between the piezoelectric layer 14 and the upper electrode 16. A symmetric view is presented for simplicity. A symmetric view only shows one half of the device, but the un-illustrated half is identical to the illustrated half. The piezoelectric layer is constructed over an acoustic Bragg mirror 102 supported by substrate 11. In this embodiment, the resonator is surrounded by a field fill 104. Finally, a perfectly matched layer (PML) 106 surrounds the structure to simplify the complexity of the finite element simulation.

Figure 8B:
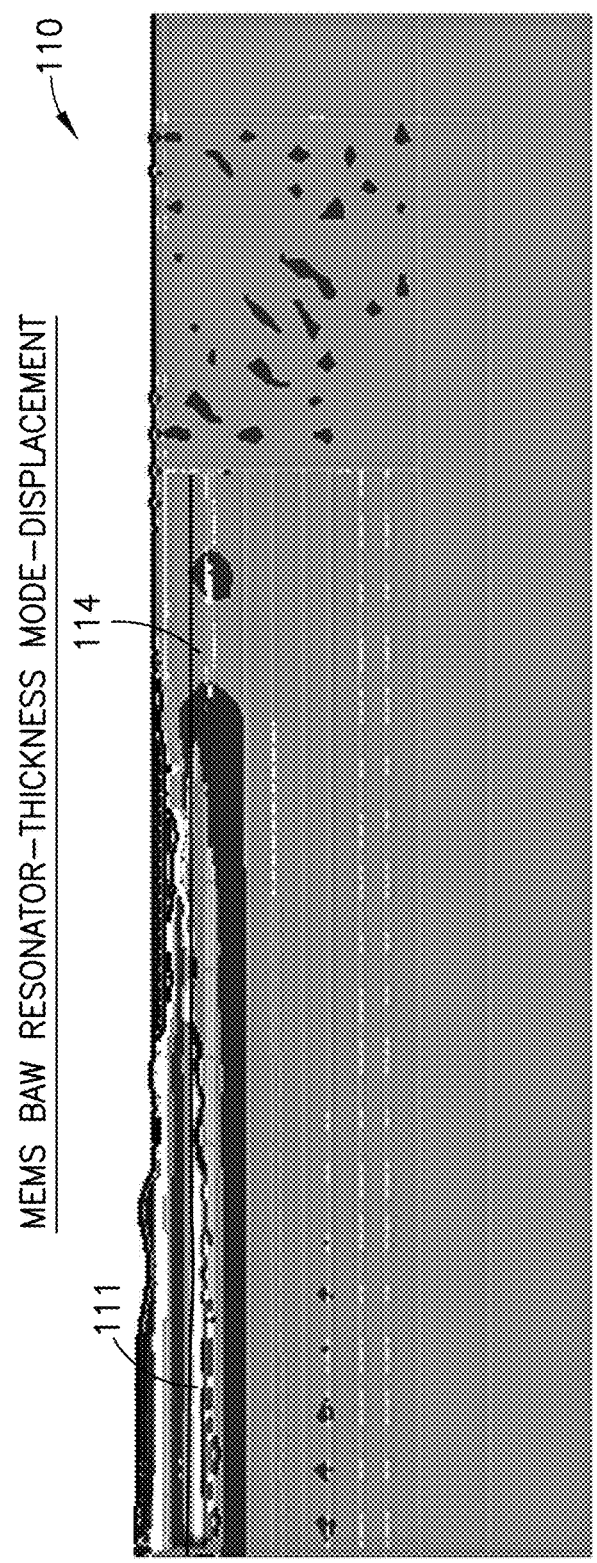
FIG. 8B is a displacement view of the SMR illustrated in FIG. 8A (simulated using finite element analysis).

FIG. 8B is a displacement view 110 of the SMR of FIG. 8A. The out-of-plane displacement 111 in the piezoelectric layer 14 (from a finite element simulation), which is illustrated as a multilayer, is shown at the series resonance of the device. The displacement profile 111 indicates that the resonance is a thickness-extensional mode resonance.

Figure 9A:
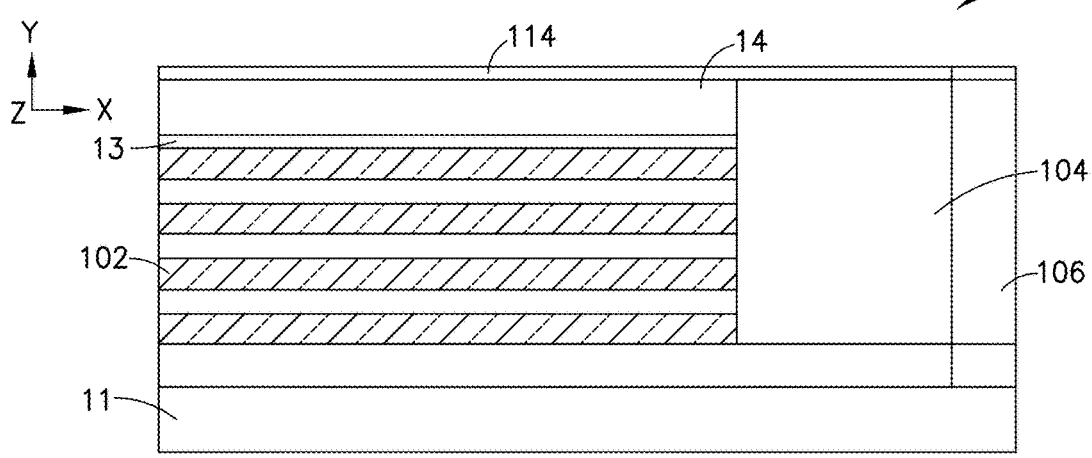
FIG. 9A is a symmetric cross section view of a MEMS solidly-mounted resonator with AlN piezoelectric, tungsten lower electrode and a NiTi upper electrode

FIG. 9A is a schematic cross section view 113 of a MEMS solidly-mounted resonator (SMR) with AlN piezoelectric 14, tungsten lower electrode 13 and a NiTi upper electrode 114. Since the NiTi conductive electrode provides a temperature compensation function, there is no separate temperature compensation layer. Again, the schematic view is symmetric for simplicity. The piezoelectric layer and the electrodes are constructed on an acoustic Bragg mirror 102 on a substrate 11. In this embodiment, the resonator is surrounded by a field fill 104. Finally, a perfectly matched layer (PML) 106 is illustrated to surround the structure to simplify the complexity of the finite element simulation.

Figure 9B:
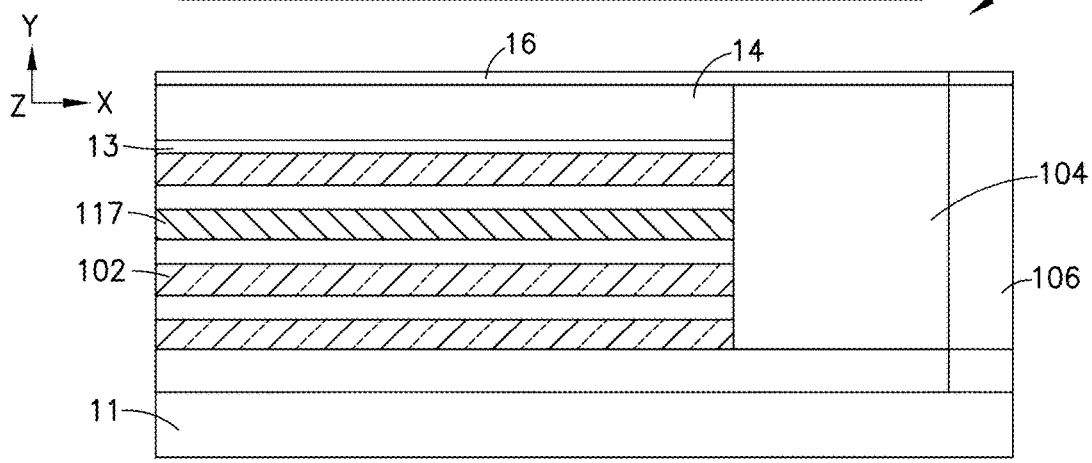
FIG. 9B is a symmetric cross section view of a MEMS solidly-mounted resonator with AlN piezoelectric, tungsten lower electrode and upper electrode, and a NiTi layer in the Bragg acoustic reflector.

FIG. 9B is a schematic cross section view 116 of a MEMS solidly-mounted resonator (SMR) with AlN piezoelectric, tungsten lower electrode 13 and upper electrode 16 and a NiTi temperature compensating Bragg layer 117. A symmetric view is presented for simplicity. The electrodes and piezoelectric material are constructed on an acoustic Bragg mirror 102 on a substrate 11. In this embodiment, the resonator is surrounded by a field fill 104. Finally, a perfectly matched layer (PML) 106 surrounds the structure to simplify the complexity of the finite element simulation.

Figure 10:
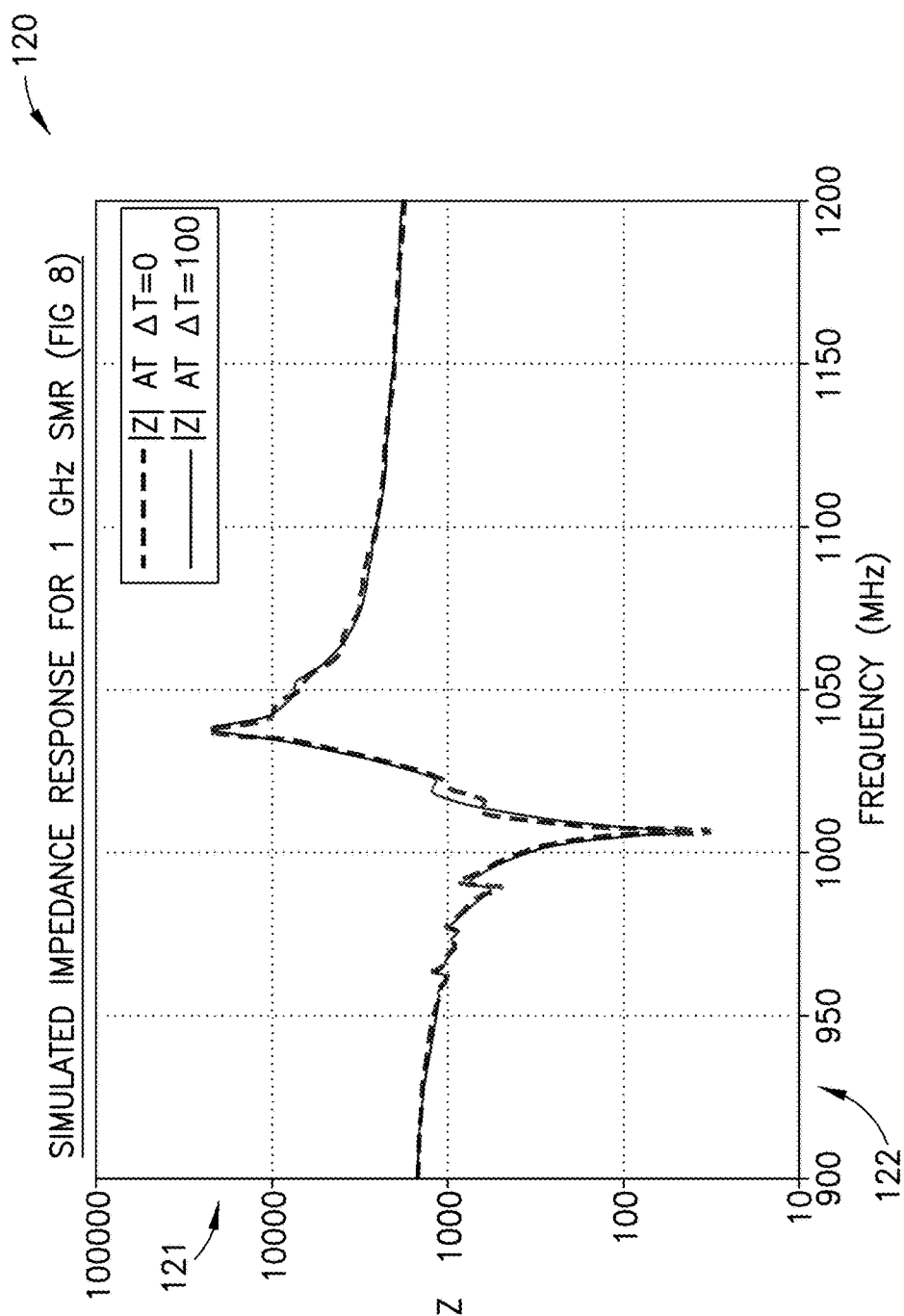
FIG. 10 is a graph view of a simulated impedance response of the SMR of FIG. 8 with a NiTi temperature compensation layer at two temperature values.

FIG. 10 is a graph 120 of the simulated impedance response of the solidly-mounted NiTi-compensated resonator presented in FIGS. 8A and 8B vibrating in thickness-extensional mode. The response was simulated at temperatures of 0° C. and 100° C. by finite-element simulation. Resistive losses were disregarded. The magnitude of impedance 121 is plotted against frequency 122. The resonator has a series-resonance Q of about 2500 and a k$^2$ of 7.4%. A comparable SiO$_2$-compensated resonator would have a series-resonance Q of 2000 and a k$^2$ of 3.5%. The temperature coefficient of frequency is about +0.1 ppm/K.

Figure 11:
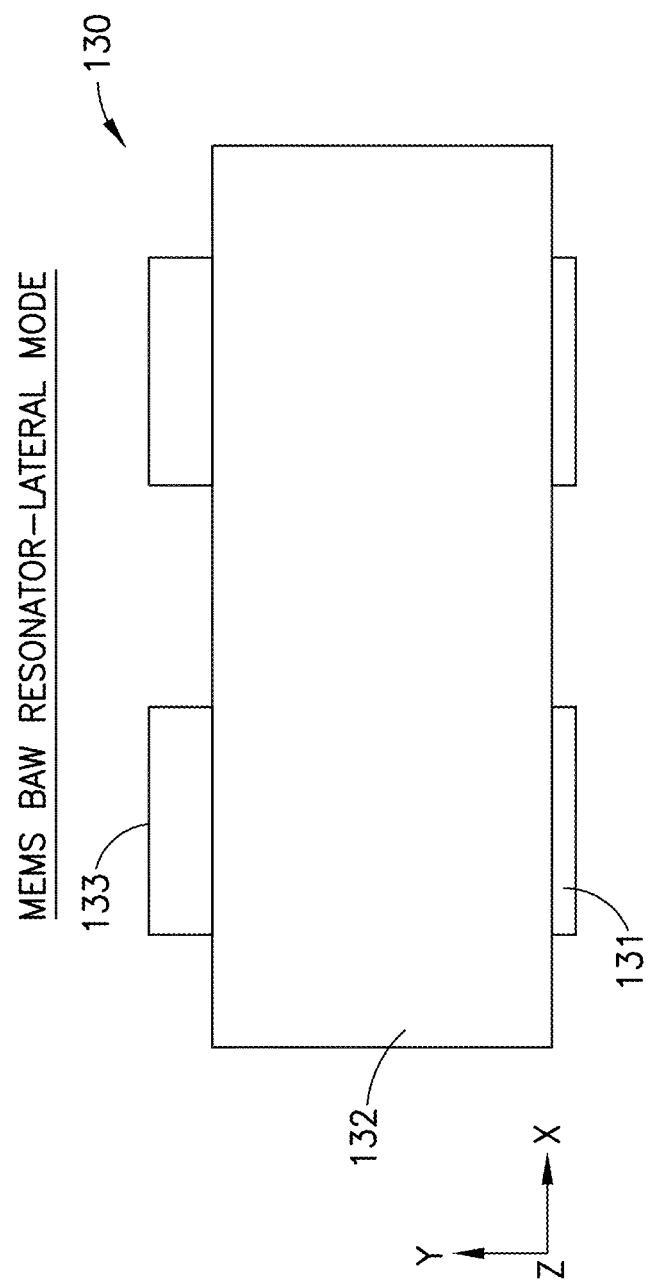
FIG. 11 is a cross section view of a MEMS lateral mode BAW resonator.

In another embodiment, presented in FIG. 11, a lateral-mode acoustic resonator has NiTi as the upper electrode 133, AlN as the piezoelectric layer 132, and tungsten as a lower electrode 131. As an upper electrode, NiTi performs the dual functions of charge collection/distribution, and as a temperature compensating layer. FIG. 11 is a schematic cross section view 130 of a MEMS lateral mode BAW resonator with a series resonance at around 1.36 GHz. The structure is released from the substrate (as required to support the lateral mode) and the supporting substrate is not shown in this cross-section for simplicity. The lower electrode 131 of the lateral resonator is tungsten, while the upper electrode 133 is NiTi. AlN is the piezoelectric transducer 132. The NiTi performs the function of the electrode as well as the temperature compensation function. Alternative embodiments (not shown) have a bilayer or multi-layer upper electrode, with NiTi as one of the layers, with the other layer(s) of lower electrical resistivity performing charge collection and distribution functions.

Figure 12:
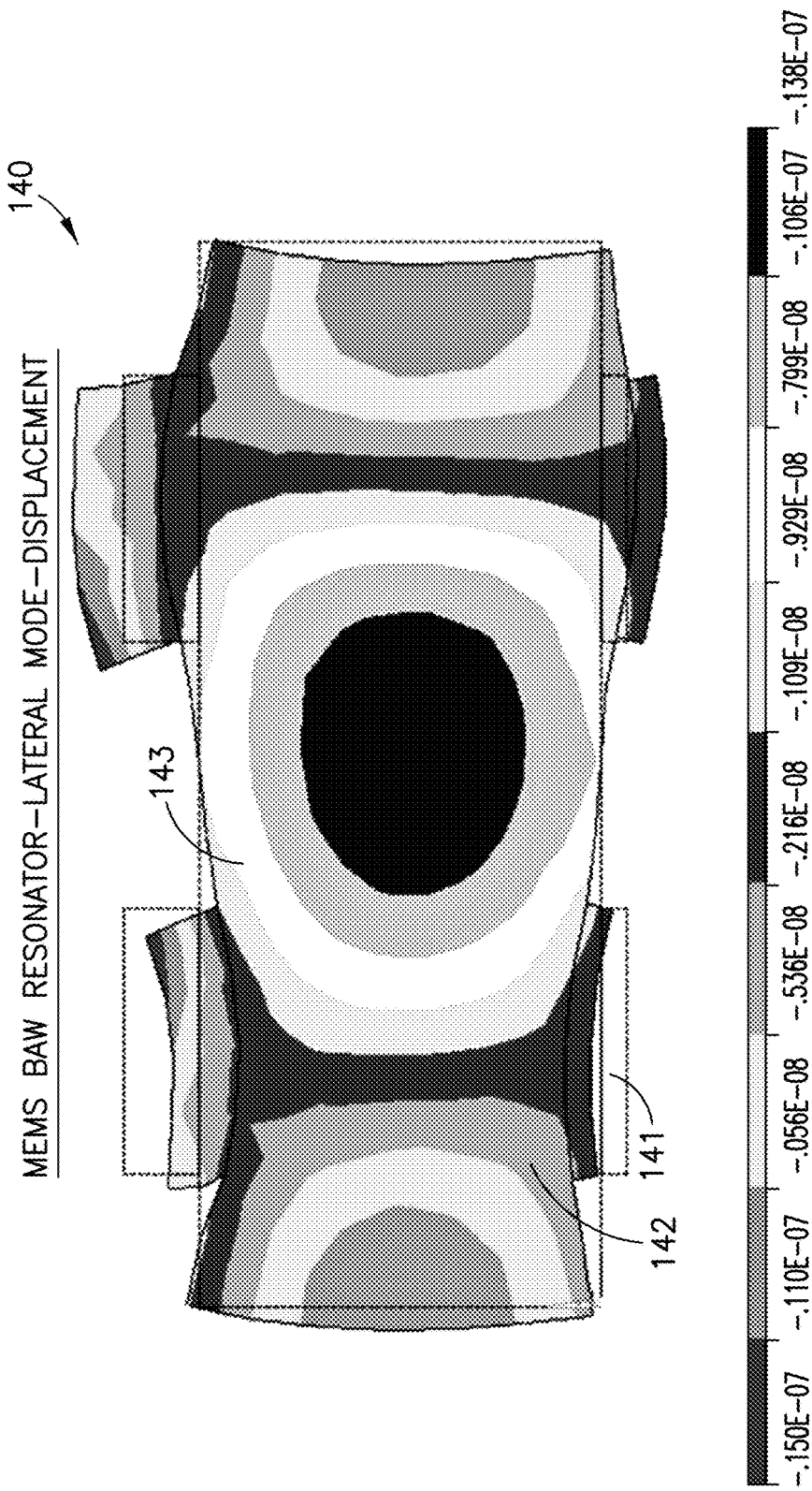
FIG. 12 is a displacement view of a lateral mode BAW resonator of FIG. 11.

FIG. 12 is a displacement view 140 of a lateral mode BAW resonator of FIG. 11 (lower electrode 141 in FIG. 12 corresponds to lower electrode 141 in FIG. 11). FIG. 12 shows the in-plane displacement (142, 143) computed by finite element simulation at the series resonance frequency. The lateral resonator displacement profile indicates that the resonance is a lateral-field-extensional mode.

Figure 13:
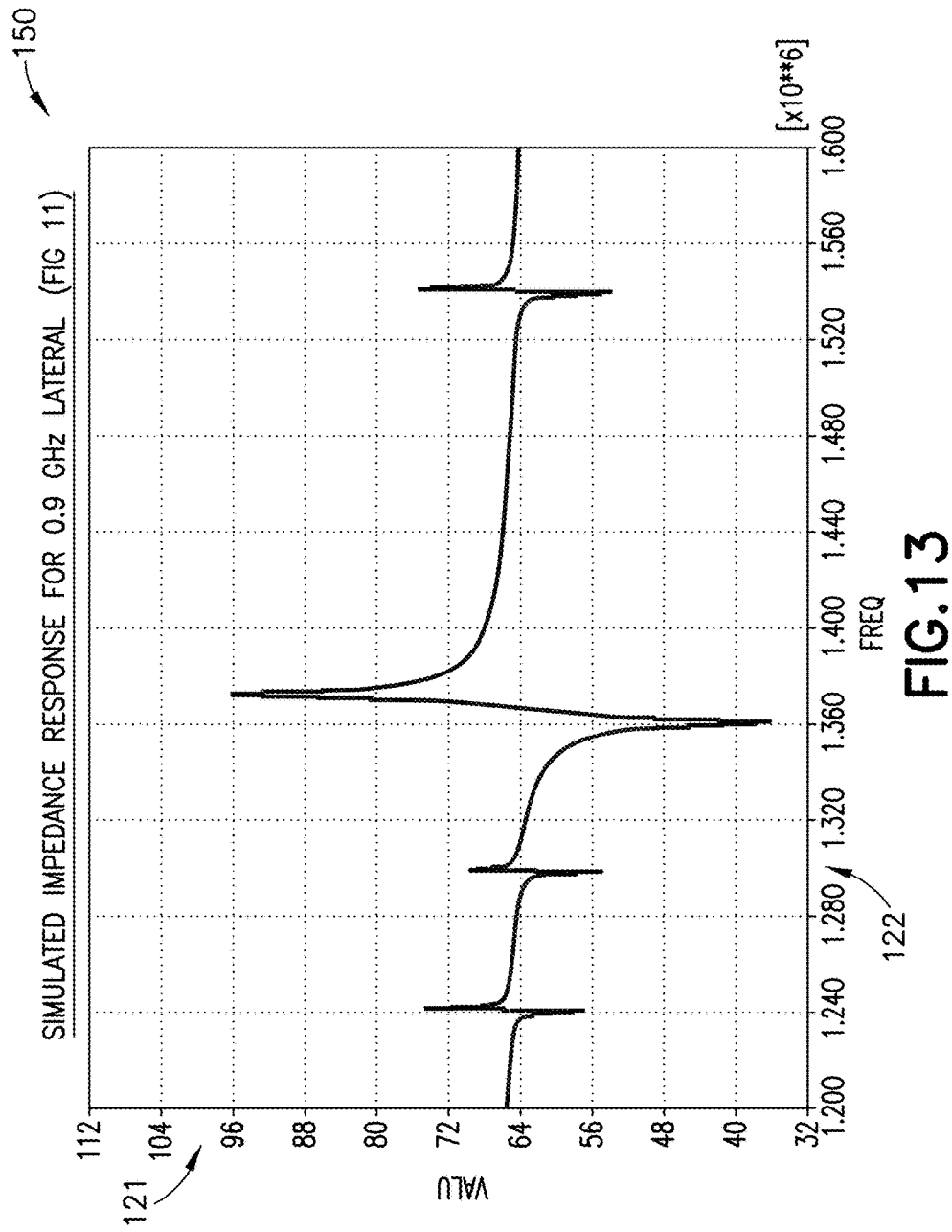
FIG. 13 is a graph view of a simulated impedance response of the lateral resonator of FIG. 11, at two temperature values.

FIG. 13 is a graph 150 of a simulated impedance response of the lateral resonator of FIG. 11, at two temperature values of 0° C. and 100° C. Resistive losses are disregarded. The temperature coefficient of frequency is about −0.1 ppm/K. The $k^2$ is about 3.3% and the series Q is about 2700, which are much higher values of $k^2$ and Q than would be achieved with a comparable lateral-mode BAW resonator compensated by $SiO_2$.

An analysis similar to those presented above indicates that a lumped mass-spring mechanical resonator wherein the strain energy is confined to the flexural springs can be temperature compensated by constructing the springs out of NiTi, or as a bi- or multi-layer stack that contains NiTi. In the case where NiTi is the only material in the spring, a material composition that corresponds to Point B on FIG. 5 should be selected to ensure consistent performance over the operating temperature range of the device. In multi-layer stacks, a composition have a percentage nickel that exceeds above Point B would be suitable, depending on the shape, size, temperature coefficient and other details of the other materials composing the spring.

The use of the positive-TCC material described herein provides greater device design and performance flexibility. Specifically, the degree of temperature compensation provided by the positive TCC is influenced by both thickness and composition. By varying the composition and thickness of the positive-TCC material, the temperature compensation provided can be adapted to the device requirements.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A resonator device having at least one electrode disposed to cooperate with a piezoelectric material to provide an electrical response to a mechanical state, the resonator further comprising a temperature compensation layer of a temperature compensation material, wherein the temperature compensation layer is selected from the group consisting of a first top electrode, a second bottom electrode, and a separate layer, wherein the temperature compensation material has a temperature coefficient that depends upon relative amounts of individual constituents of a composition of the temperature compensation material, wherein the temperature compensation material is a nickel titanium alloy, wherein an amount of nickel by weight in the alloy is between about 27 and 42 percent by weight and is selected such that the composition provides the temperature compensation material with a positive temperature coefficient of stiffness (TCC), and wherein the temperature compensation layer is disposed adjacent to the piezoelectric material.

2. The resonator device of claim 1 wherein the piezoelectric material of the device is formed as at least one piezoelectric layer.

3. The resonator device of claim 1 wherein the piezoelectric material of the device is formed as a plurality of piezoelectric layers.

4. The resonator device of claim 1 wherein the amount of nickel in the alloy does not exceed about 34 percent by weight.

* * * * *